United States Patent [19]
Nishioka et al.

[11] Patent Number: 5,648,885
[45] Date of Patent: Jul. 15, 1997

[54] GIANT MAGNETORESISTIVE EFFECT SENSOR, PARTICULARLY HAVING A MULTILAYERED MAGNETIC THIN FILM LAYER

[75] Inventors: Koichi Nishioka, Takefu; Hideo Fujiwara, Tokyo; Takayuki Iseki, Kanagawa-ken, all of Japan

[73] Assignees: Hitachi, Ltd., Tokyo; Victor Company of Japan, Ltd., Yokohama, both of Japan; University of Alabama, Tuscaloosa, Ala.

[21] Appl. No.: 522,084

[22] Filed: Aug. 31, 1995

[51] Int. Cl.$^6$ ........................................ G11B 5/39
[52] U.S. Cl. ................ 360/113; 338/32 R; 324/252
[58] Field of Search .................. 360/113; 338/32 R; 324/252; 428/611, 635, 928

[56] References Cited

U.S. PATENT DOCUMENTS

| | | | |
|---|---|---|---|
| 5,134,533 | 7/1992 | Friedrich et al. | 360/113 |
| 5,159,513 | 10/1992 | Dieny et al. | 360/113 |
| 5,287,238 | 2/1994 | Baumgart et al. | 360/113 |
| 5,301,079 | 4/1994 | Cain et al. | 360/113 |
| 5,313,186 | 5/1994 | Schuhl et al. | 338/32 R |
| 5,315,468 | 5/1994 | Lin et al. | 360/113 |
| 5,366,815 | 11/1994 | Araki et al. | 428/611 |
| 5,373,238 | 12/1994 | McGuire et al. | 324/252 |

FOREIGN PATENT DOCUMENTS 6-325934  11/1994  Japan .

OTHER PUBLICATIONS

R.L. White, "Giant Magnetoresistance: A Primer", IEEE Transactions on Magnetics, vol. 28, No. 5, Sep. 1992, pp. 2482–2487.

Ultrathin Magnetic Structures II, "Measurement Techniques and Novel Magnetic Properties", Springer–Verlag, 1994, pp. 174–194.

*Primary Examiner*—Stuart S. Levy
*Assistant Examiner*—William J. Klimowicz
*Attorney, Agent, or Firm*—Fay, Sharpe, Beall, Fagan, Minnich & McKee

[57] ABSTRACT

A spin-valve read head of the giant magnetoresistive type in a data storage system has at least one magnetic thin film layer comprising a plurality of magnetic thinner film layers of ferromagnetic material with the same crystal plane orientation from one magnetic thinner film to another, and an interface between adjacent magnetic thinner films having a discontinuity in single-crystal epitaxial growth. Each magnetic thinner film layer is composed of an alloy including each of Fe, Ni and Co and has a weight ratio of Co:Fe equal to 90:10. The crystal has a crystal structure that is face centered cubic and a crystal plane orientation (111) that is highly ordered. The interfaces may be layers of Ni or Cu. The layers all exhibit a condition of magnetic orientation and annealed structure resulting from being annealed and cooled in a magnetic field sufficiently to have an anisotropic energy of the first magnetic thin film layer in an equilibrium state that is smaller than an identical structure before annealing.

56 Claims, 13 Drawing Sheets

GIANT MAGNETORESISTIVE EFFECT SENSOR, PARTICULARLY HAVING A MULTILAYERED MAGNETIC THIN FILM LAYER

BACKGROUND OF THE INVENTION

The present invention relates to a magnetoresistive sensor employing at least two magnetic thin film layers whose relative orientations of magnetization change in response to a changing externally applied magnetic field according to the giant magnetorestrictive effect. The invention is used particularly for obtaining information stored as magnetic domains on a magnetic storage medium in an information storage and utilization system.

Magnetoresistive (MR) sensors have been known to employ the anisotropic magnetoresistive (AMR) effect in which a component of the resistance in the sensor varies in proportion to the square of the cosine of the angle between the magnetization of the sensor and the direction of sense current flowing through the sensor. More recently, there have been MR sensors employing the giant magnetoresistive (GMR) effect which employ a plurality of layers of magnetic material, wherein a component of the resistance varies in proportion to the cosine to the first power of the angle between the magnetization of two adjacent magnetic layers.

One particular type of GMR sensor has the magnetization of one magnetic layer fixed or pinned by various means, such as: (1) the use of an anti-ferromagnetic material on the opposite side of the one magnetic layer from the other magnetic layer; the exchange coupling between the anti-ferromagnetic material and the ferromagnetic material of the one magnetic layer will fix the magnetization of the one magnetic layer generally independently of the external magnetization that carries the information to be detected; (2) the use of hard and soft layers; and (3) an adjacent permanent magnet layer or an adjacent layer whose magnetization is fixed with an applied current. This type of GMR sensor is generally known as a spin valve. U.S. Pat. No. 5,159,513, issued Oct. 27, 1992 discloses a spin valve wherein the magnetization of one magnetic layer is fixed or pinned by either the use of an adjacent anti-ferromagnetic material or alternatively by a ferromagnetic layer of sufficiently high squareness, high coercivity and high resistance, that is magnetization harder than the other ferromagnetic layer. Furthermore, a double spin valve is known wherein there are three ferromagnetic layers, with the outer two ferromagnetic layers having their magnetization pinned in the same direction, for example by the use of adjacent anti-ferromagnetic materials, leaving the middle ferromagnetic layer with its magnetization free to be affected by the applied external information magnetic fields.

Although the present invention has application broadly to all GMR effect sensors, it is most preferably and most advantageously usable with a spin valve or double spin valve GMR sensor. A particular detailed disclosure of spin valves is set forth in U.S. Pat. No. 5,373,238, issued Dec. 13, 1994.

Furthermore, U.S. Pat. No. 5,301,079 issued Apr. 5, 1994, discloses a GMR effect sensor wherein two ferromagnetic layers each have their magnetizations free, that is not fixed or pinned, and the sensor is so constructed that in response to the applied external magnetic fields carrying the information, magnetization in each layer is oriented at equal and opposite angles with respect to the easy axis, so that magnetization will rotate through substantially equal but opposite angles. Broadly, the present invention can be applied to the construction of one or more of such magnetic layers.

Generally, the directions of magnetization in the ferromagnetic layers may be parallel, that is the same, or they may be anti-parallel, that is extend in alternating directions for adjacent ferromagnetic layers, or at other relative angles. An example of parallel magnetization is set forth in the above mentioned U.S. Pat. No. 5,301,079, and an example of anti-parallel magnetization is disclosed in U.S. Pat. No. 5,313,186, which employs the principle that the direction of magnetization is dependent upon the thickness of non-magnetic layers between the ferromagnetic layers. Further, the direction of magnetization in adjacent ferromagnetic layers may be at various angles to each other as set forth in U.S. Pat. No. 5,287,238, for example. A detailed disclosure of parallel and anti-parallel magnetization for the GMR effect is set forth in White, Robert L., "Giant Magnetoresistance: A Primer", *IEEE Transactions on Magnetics*, Vol. 28, No. 5, September 1992, pages 2482–2487.

A thin film magnetic or ferromagnetic layer as used in a sensor of the AMR or GMR effect type is defined herein as a homogeneous single layer film or a multilayer film wherein the individual layers of the multilayers may be the same or different material, but in either event the thin film magnetic or ferromagnetic layer functions as a single entity in the sensor to provide a single magnetization direction that angularly moves relative to the sense current (AMR) or relative to the magnetization of another thin film magnetic or ferromagnetic layer so that the cosine to the second power (AMR) or the cosine to the first power (GMR) of such angle is an indication of the strength of an externally applied information containing variable magnetic field.

In order to function, these two magnetic layers are sufficiently separated, preferably by a metallic non-magnetic layer. The above-mentioned article "Giant Magnetoresistance: A Primer" states that to obtain a GMR effect, it is necessary that the thickness of the thin film layers must be less, preferably a fraction, of the mean free path of an electron in the array of thin film ferromagnetic layers separated by the thin film non-magnetic layer.

A multilayer thin film ferromagnetic layer is disclosed in *Ultrathin Magnetic Structures II*, "Measurement Techniques and Novel Magnetic Properties", Springer-Verlag, pages 174–194. More particularly, this document discloses a spin valve having an anti-ferromagnetic layer (FeMn), a first magnetic layer that is a multilayer of NiFe film and a Co film, a separation non-magnetic thin film layer of Cu, and a second thin film magnetic layer as a multilayer of a Co film and a NiFe film. It is disclosed that in the multilayer, the relative positions of the Co and the NiFe thin films may be reversed. The present invention relates to one or more of the thin film magnetic layers being a multilayer.

The above-cited documents disclose many different materials to be used as substrates, coupling layer, bonding layer, thin film magnetic layers, non-magnetic separation layer, anti-ferromagnetic layer, oxidation protection and passivation layers, magnetic shielding, and conductive layers. Further, these documents suggest different thicknesses and discuss other properties of the materials.

In the AMR and the GMR type sensors, a sensing electrical current is passed through the layers, and a voltage across the layers (direct) or across a resistance in parallel or series with the layers (indirect) is then preferably sensed as an indication of the information. Optionally, a non-information magnetic field may be passed longitudinally through the layers to reduce or eliminate Barkhausen noise. While the above mentioned distinctions between the AMR effect and the GMR effect sensors use the cosine of the angle as an example, it is understood that such is not restrictive, as it has been recognized that, of course, the sine of the angle may be used.

In general, soft magnetic properties are desirable for the magnetic layer whose magnetization is free to rotate in response to the applied magnetic field. As used herein, soft magnetic properties mean low coercivity, low anisotropy field and low magnetostriction. A low coercivity may be for example 30 Oe or less. Generally a material such as Co has a high coercivity, for example about 30 Oe higher than the about 30 Oe coercivity of NiFe that is commonly used as the ferromagnetic layer material. These low and high terms are well defined in the art, particularly as used in the above-cited documents, and its disclosure with respect thereto is incorporated herein.

A large magnetoresistance change ratio (MR ratio) is preferable for magnetoresistive heads in terms of achieving a large dynamic range. It is a feature of the GMR effect sensor that the MR ratio is many times that of the AMR effect sensor.

SUMMARY OF THE INVENTION

It is an object of the present invention to improve a giant magnetoresistive type sensor.

A main object of the present invention is to give soft magnetic properties, such as low coercivity, low anisotropy field and low magnetostriction, to a magnetic thin film layer, particularly the first magnetic thin film layer of a Co alloy that heretofore has been known as having hard magnetic properties. A further object of the present invention is to increase the MR ratio in a spin valve sensor. A further object of the present invention is to provide a strong pinning effect in a magnetic thin film layer of a spin valve by improving the texture of a magnetic thin film layer, which is achieved by multilayering the second magnetic thin film layer and/or by multilayering the first magnetic thin film layer that preceeds the second magnetic thin film layer in position, each to improve the crystal plane orientation and crystal grain size.

In order to achieve low coercivity in the magnetic thin film layer, it is effective to make the magnetic thin film layer a multilayered structure, wherein the thickness of each of the multi-layers is preferably less than 30 angstroms. For example, in a Co alloy film, because of a relatively large magnetocrystalline anisotropy energy, it is hard to achieve low coercivity even in a polycrystalline film. When the film is made of a multilayered structure as in the present invention, wherein the thickness of each thinner film is smaller than a specific value, the grain size becomes smaller and crystalline anisotropy is averaged out by the exchange coupling at the interfaces of the grains resulting in the achievement of a low coercivity. This is particularly the case when the thickness is held to be within the range of 10 to 30 angstroms for the thinner film layers of the multilayering.

In terms of achieving a higher pinning field in a magnetic thin film layer, a highly oriented crystal structure is important, preferably the (111) plane in the other layers of magnetic thin film, the non-magnetic thin film and anti-ferromagnetic thin film. Therefore, these four layers should have the same crystal structure, for example faced-centered cubic (fcc), and should have the same crystal plane orientation with each other, for example substantially parallel or highly oriented crystal planes, preferably (111).

To achieve a highly oriented texture of a specific crystal plane in layers of the first magnetic thin film layer, the non-magnetic thin film layer, the second magnetic thin film layer and the anti-ferromagnetic thin film layer, it is effective to deposit an underlayer such as Ta, Zr, Nb, Ti, or Hf before depositing the first magnetic thin film layer, and it is also effective to use Ni in the alloy of the first and/or second magnetic thin film layers.

In order to avoid a complicated magnetic domain structure due to the magnetoelastic effect, which results in Barkhausen noise, a small magnetostriction value of the first magnetic thin film layer is preferable. The value should be smaller than $3\times10^{-6}$, preferably smaller than $1\times10^{-6}$.

The use of Co in an alloy of the first and/or second magnetic thin film layer provides higher MR ratios than would be obtained with NiFe alone. Co or the Co alloy is suitable for the magnetic layers. The Co alloy is usually considered to have a high anisotropy field of about 20 Oe in the equilibrium state, the origin of which is mainly atomic pair ordering. To reduce this value, the present invention anneals and cools the sensor in a magnetic field.

In terms of achieving a highly ordered texture in the first and/or second magnetic thin film layers, a multilayered structure of thinner films of a Co alloy separated by thinner intermediate layers of Cu or Ni or a Ni alloy or a Cu alloy is more preferable than a single-crystal structure of Co or Co alloy because this discontinuity, particularly of intermediate thinner film layers, improves the oriented texture. Such a highly oriented texture is important for exchange couplings. Further, the orientation of any specific layer depends upon the orientation of layers epitaxially grown previously, so that the use of multilayering for improving the oriented texture of a first thin film layer will also improve the orientation of a subsequently epitaxially grown second magnetic thin film layer, even though the second magnetic thin film layer is not multilayered.

While the present invention is applicable to multilayering of Co, or a CoFe alloy, preferably one with nickel, it is most preferable that when a CoFe alloy is used alone or as a component of an alloy further containing nickel, the ratio of Co:Fe is 90:10, which provides zero magnetostriction.

Soft magnetic properties can be achieved by making the first and/or second magnetic thin film layer of a multilayered structure and reducing the anisotropy energy by annealing. The present invention allows the wide possibility of choosing the magnetic material, that is magnetic materials may be chosen among those previously thought not to be applicable because they were not soft magnetic materials. This has been specifically proven with respect to Co, which is considered a hard magnetic material, but with the present invention Co can be used to construct a soft magnetic thin film layer. As a result, a high MR ratio and high sensitivity can be realized, particularly for a spin valve. With respect to exchange coupling, a multilayered structure with the same crystal structure and the same preferred orientation provides an improved texture for a specific thin film layer. As a result, a strong exchange coupling can be achieved.

A spin-valve read head of the giant magnetoresistive type in a data storage system has at least one magnetic thin film layer comprising a plurality of magnetic thinner film layers of ferromagnetic material with the same crystal plane orientation from one magnetic thinner film to another, and an interface between each adjacent ones of magnetic thinner films having a discontinuity in single-crystal epitaxial growth. Each of the magnetic thinner film layers is composed of an alloy including each of Fe, Ni and Co. The crystal texture is a crystal structure that is face-centered cubic and the crystal (111) plane is highly oriented. The interfaces may be Ni or Cu thin film layers. The layers all exhibit a condition of magnetic orientation and annealed structure resulting from being annealed and cooled in a magnetic field sufficiently to have an anisotropy energy of the first magnetic thin film layer in an equilibrium state that is smaller than an identical structure before annealing.

BRIEF DESCRIPTION OF THE DRAWINGS

Further objects, features and advantages of the present invention will become more clear from the following detailed description of a preferred embodiment, described with respect to the accompanying drawing.

DETAILED DESCRIPTION OF A PREFERRED EMBODIMENT

While the present invention may broadly be used for the detection of variations in external magnetic fields, it is particularly useful as a read head for an information storage and retrieval system, wherein the information is stored as an array of magnetic domains on a magnetic medium. The magnetic medium may be of any type, for example a tape, a cylinder, one or more hard disks, or one or more floppy disks. The magnetic domains are generally arranged along tracks, which may be circular, spiral, helical, or of indefinite lengths.

Figure 1:
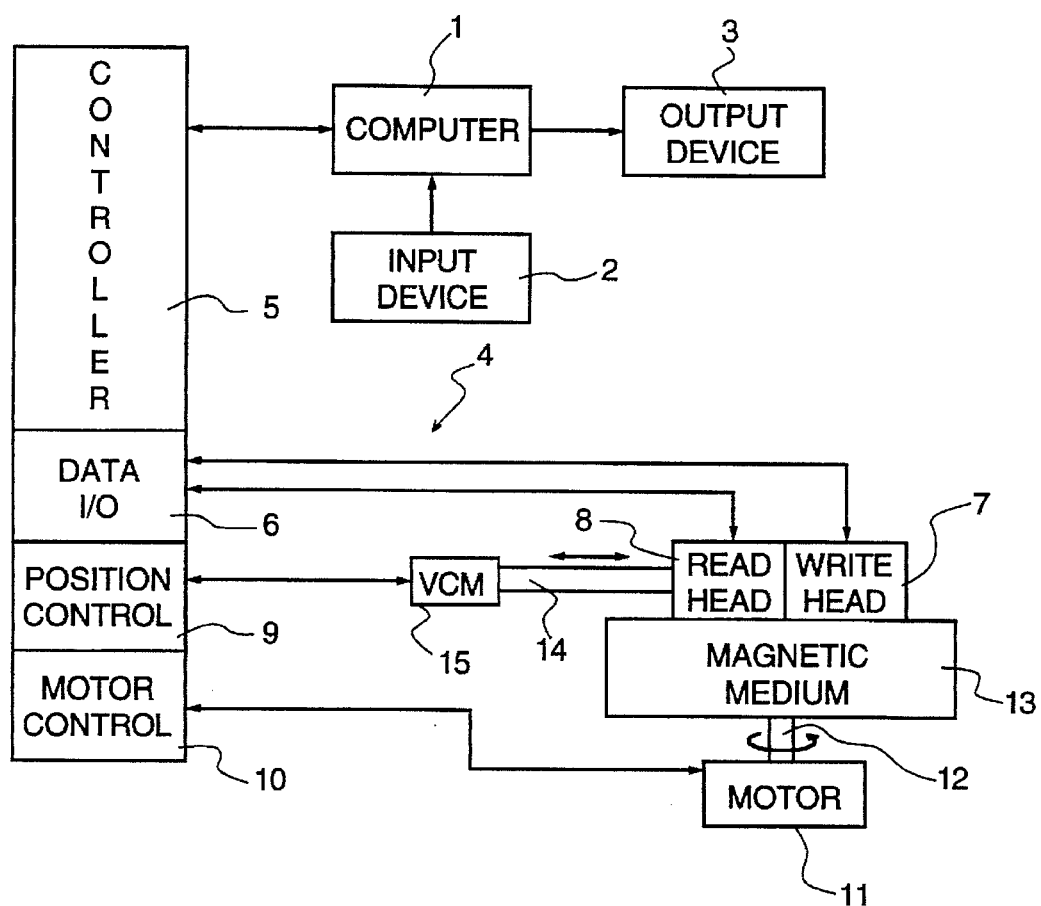
FIG. 1 is a schematic illustration of an information storage and retrieval system of a preferred embodiment of the present invention.

A representative storage and retrieval device is illustrated in FIG. 1. A general purpose computer 1 receives input from an input device 2, which may be one or more of an interface with a network, a keyboard, a scanner, or the like. The computer in addition to having one or more input devices can be connected to one or more output devices 3, which may be an interface with a network, a printer, a display screen, or a modem. In addition to any other storage associated with a computer 1, the computer writes information to and receives information from a peripheral magnetic storage device 4. The magnetic storage device includes: (1) a controller 5 that in turn includes a data input/output section 6 for outputting information signals to a write head 7 and inputting information from a read head 8, in addition to perhaps receiving feedback signals from the heads, (2) a position control section 9 that outputs head position control signals and inputs head position feedback signals, and (3) a motor control section 10. The motor control section 10 controls the speed, stop, start, etc. of movement of the magnetic medium relative to the heads, and in this case provides rotation control signals to a motor 11 that rotates, through shaft 12, one or more disk type magnetic mediums 13. A transducer, preferably having a separate write head 7 and separate read head 8 is moved generally radially of the disk 13, to contact or float slightly above the disk 13, an interconnecting arm 14 and a voice coil motor (VCM) 15.

As mentioned, the particular storage device of FIG. 1 is representative. The structure of FIG. 1 will not be discussed further in detail because its operation is well known. The improvement portion of the present invention resides in the structure of the read head 8.

Figure 2:
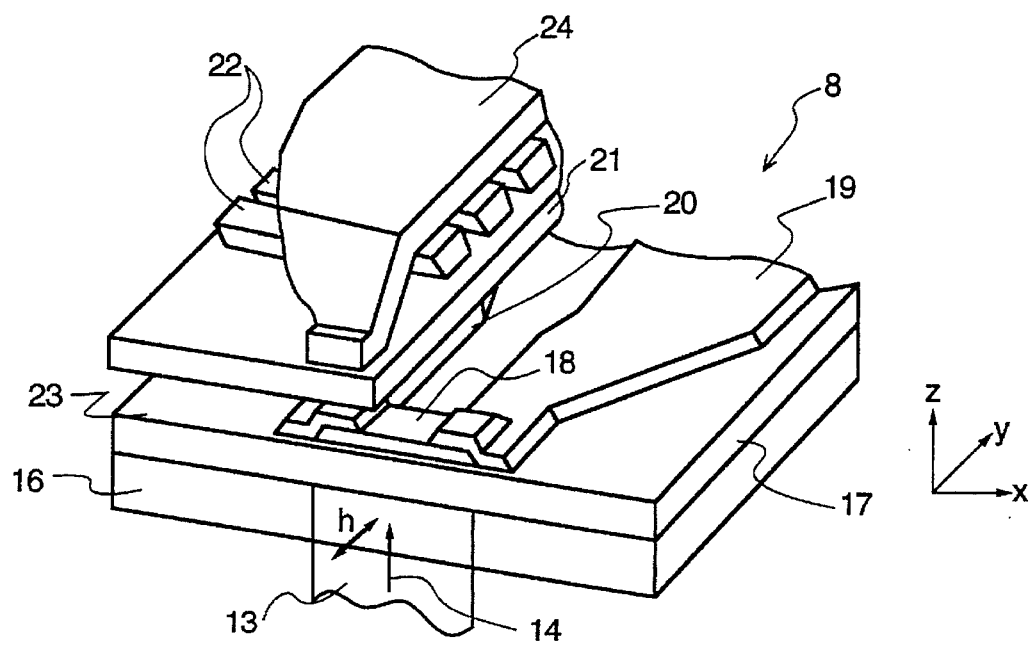
FIG. 2 is a partial perspective view of the structure of a magnetoresistive sensor of the present invention, particularly employed as a part of a read/write head of the information storage and retrieval system that is disclosed in FIG. 1.

The preferred embodiment of the read head of the present invention is disclosed in FIG. 2. A portion of the magnetic medium 13 is shown having a transducing direction 14 relative to the read head 8 to produce relative movement therebetween along the Z axis. The track of magnetic domains moves generally along the Z axis immediately adjacent the read head, while the voice coil motor (VCM) 15 relatively moves the read head and track along the X axis for accessing. The magnetic medium 13 has a plurality of magnetic domains along the track in the Z direction whose magnetic field h will accordingly vary along the Y axis at the read head 8 due to the relative movement along the Z axis, and it is this magnetic field h variation that represents the stored information and which is to be read.

The write head 7 and read head 8 are composed of layers, some of which are shown in FIG. 2 and some of which are conventional and not shown, such as bonding layers, passivation layers, and the like. During the manufacture, starting with a substrate 16, a lower shield 17 is deposited, and thereafter the read sensor 18 is epitaxially grown, and the sensing current input lead 19 and sensing current output lead 20 are deposited to form the read head; a write head comprising an upper shield or lower core 21 is deposited, coils 22 are deposited, and an upper core 9 is deposited. Preferably, the dielectric layer 23, for example $Al_2O_3$ is deposited between the sensor 18 and the lower shield 17 and between the sensor 18 and the upper shield 21.

The substrate 16 may comprise one of the following materials: silicon, glass, ceramic, semiconductor, sapphire, quartz, magnesium oxide, silicon with an insulating layer, or gallium arsenide. The upper and lower shields 17 and 21 may comprise known materials for this purpose. The leads 19 and 20 may comprise one of: Al, Cu, Au, and Ag.

Figure 3:
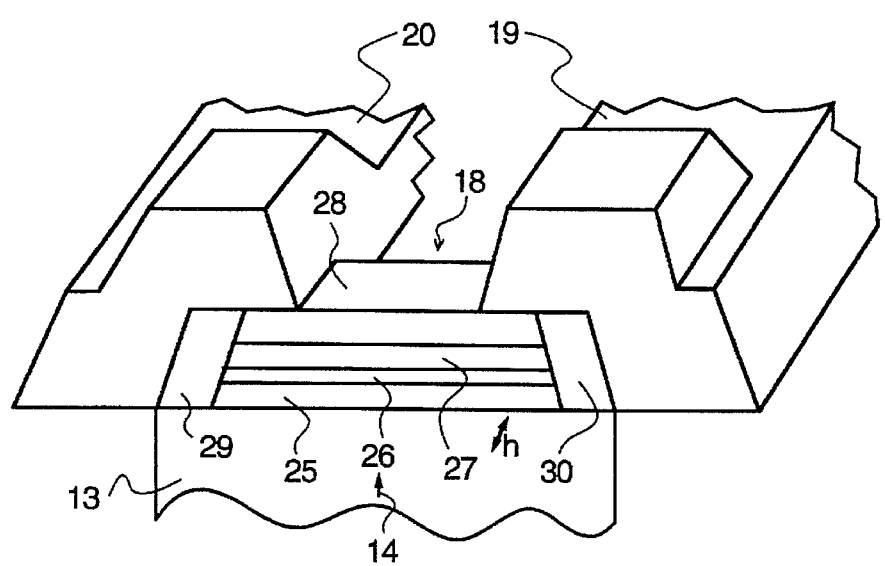
FIG. 3 is a portion of FIG. 2 enlarged and shown in more detail, specifically relating to the read sensor of the present invention.

Generally, the structure of FIG. 2 is conventional with respect to the preferred embodiment, and the improvement of the present invention resides in the structure and method of making the read sensor 18, which is shown in greater detail in FIG. 3, which is a portion of FIG. 2. The sensor 18 is of the magnetoresistive type, specifically the GMR effect type, wherein a sensing current from input lead 19 passes through the sensor 18 and returns by output lead 20. The voltage across the sensor 18 is directly or indirectly measured, and its variation is an indication of the information contained on the magnetic medium 13, because the voltage varies as the resistance of the sensor varies. The resistance varies as the externally applied magnetic field h varies, which field in turn varies in accordance with the information-containing magnetic domains of the magnetic medium varying as they pass the sensor 18.

More specifically, the sensor 18 includes a first magnetic thin film layer 25, a non-magnetic thin film layer 26, a second magnetic thin film layer 27, an anti-ferromagnetic thin film layer 28, and opposed magnetic bias field applying electrodes 29, 30. In a known manner, the bias electrodes 29, 30 apply a longitudinal magnetic field through the layers 25, 26, 27, 28 to reduce Barkhausen noise, which feature is optional.

The preferred embodiment sensor of FIG. 3 is a single spin valve, and the improvement of the present invention resides specifically in one or both of the first and second magnetic thin film layers 25 and 27, and the effect their structure has on the other layers and the effect upon the entire storage apparatus. As mentioned above, the improvement portion of the present invention may more broadly be applied to other sensors, such as the double spin valve, and the like, as well as other apparatus in general.

In FIGS. 4–7, 9–15, actual experimental data is represented to show the importance of the present invention. Prior to reviewing this experimental data, further details of the preferred embodiment will be described with respect to FIG. 8, which is an enlarged portion of FIG. 3.

There is an underlayer 31 that may be of a suitable material to assist epitaxial growth and bonding, which material may be Ta, Zr, Nb, Ti, or Hf. For protection purposes, it is preferable to provide a capping layer 32, which may be composed of the same materials as underlayer 31.

As an improvement of the present invention, the first magnetic thin film layer 25 (and/or the second magnetic thin film layer 27) comprises a multilayer structure. This multilayer structure includes a plurality of magnetic thinner film layers 33 (thinner meaning thinner than the thin film layers 25, 26, 27) separated by interfaces, more specifically interfaces formed by intermediate thinner film layers 34. That is, the magnetic material thinner film layers 33 and intermediate thinner film layers 34 together present a multilayered first magnetic thin film layer 25. The magnetic thinner film layers 33 have parallel magnetization, for example all to the right in the X direction, whereas the second magnetic thin film layer 27 has a magnetization that is in a specific direction, which may be parallel, anti-parallel, perpendicular, or at an intermediate angle with respect to the direction of magnetization of the first magnetic thin film layer 25. In operation, it is critical to the present invention that the magnetization in all the thinner film layers be parallel and either fixed together or free to move together in accordance with variations in the externally applied magnetic field, and that the magnetization in adjacent magnetic thin film layers 25, 27 angularly move relatively so that the resistance of the sensor to the electric sensor current varies in proportion to the cosine of such angle.

At first, CoFe (90:10 at %) was chosen as the material for the second magnetic thin film layer 27 and the magnetic thinner film layers 33 of the first magnetic thin film layer 25, and Cu was chosen for the non-magnetic thin film layer 26 and the intermediate thinner film layers 34, because these two materials have the same crystal structure, that is face-centered cubic structure (fcc structure) and the magnetic material CoFe has almost zero magnetostriction. The same crystal structure is important when these layers are epitaxially grown, because then there is a high degree of orientation, particularly of the (111) plane being parallel to the XY plane. A Ta film of about 100 angstroms thick was used for the underlayer 31, although Zr, Ti or other suitable materials may be used for the underlayer instead of Ta. This underlayer 31 improves texturing of the film epitaxially grown on it and, as a result, improves the exchange coupling between the second magnetic thin film layer 27 and the anti-ferromagnetic thin film layer 28. The anti-ferromagnetic thin film layer 28 was constructed of a 150 angstrom thick film of FeMn. A Cu film of about 24 angstroms thick was used for the non-magnetic thin film layer 26 between the first and second magnetic thin film layers 25, 27.

Figure 4:
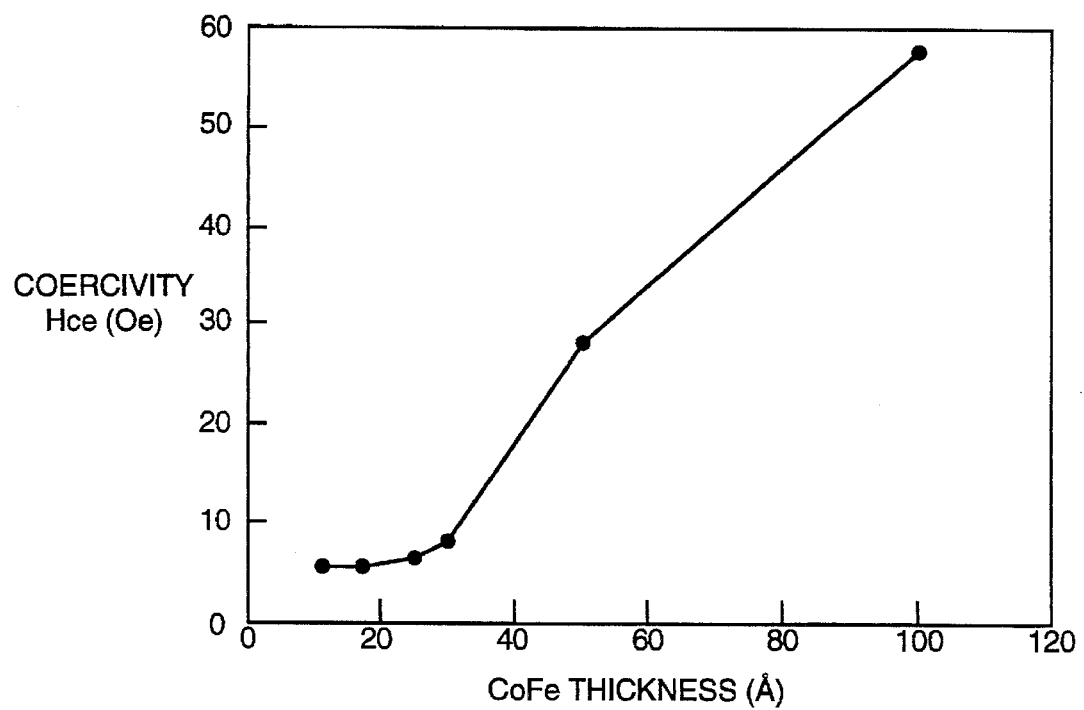
FIG. 4 is a graph showing thickness dependency of the coercivity of a CoFe film on a 100 angstrom thick Ta underlayer that is on a glass substrate.

The thickness dependency of the coercivity of the CoFe along the easy axis was examined with respect to the structure described in the preceding paragraph. The result of experimentation is shown in FIG. 4, which shows a plot of specific measured values for thicknesses of 100 angstroms, 50 angstroms, 30 angstroms, 25 angstroms, 18 angstroms, and 10 angstroms. It is seen that the coercivity decreases drastically from 57 Oe to 8 Oe with the decrease of the CoFe thickness from 100 angstroms to 30 angstroms. Thereafter, that is from 30 angstroms and below, there is a break in the curve and the decrease in coercivity is not so great.

Two kinds of spin valve films were examined while changing the CoFe thicknesses of the first magnetic thin film layer 25 as will be reported hereafter for a specific spin valve that includes, in order, the following layers:

Substrate/Ta100 Å/CoFe100 to 30 Å/Cu 24 Å/CoFe 30 Å/FeMn 150 Å/Ta 50 Å.

It is seen that decreasing the thickness from 100 to 30 angstroms, reduces the coercivity of the first magnetic thin film layer 25 to less than 10 Oe. However, the exchange coupling field between the second magnetic thin film layer 27 and the anti-ferromagnetic thin film layer 28 (hereinafter referred to as the "pinning field") also decreased to 50 Oe.

Figure 5:
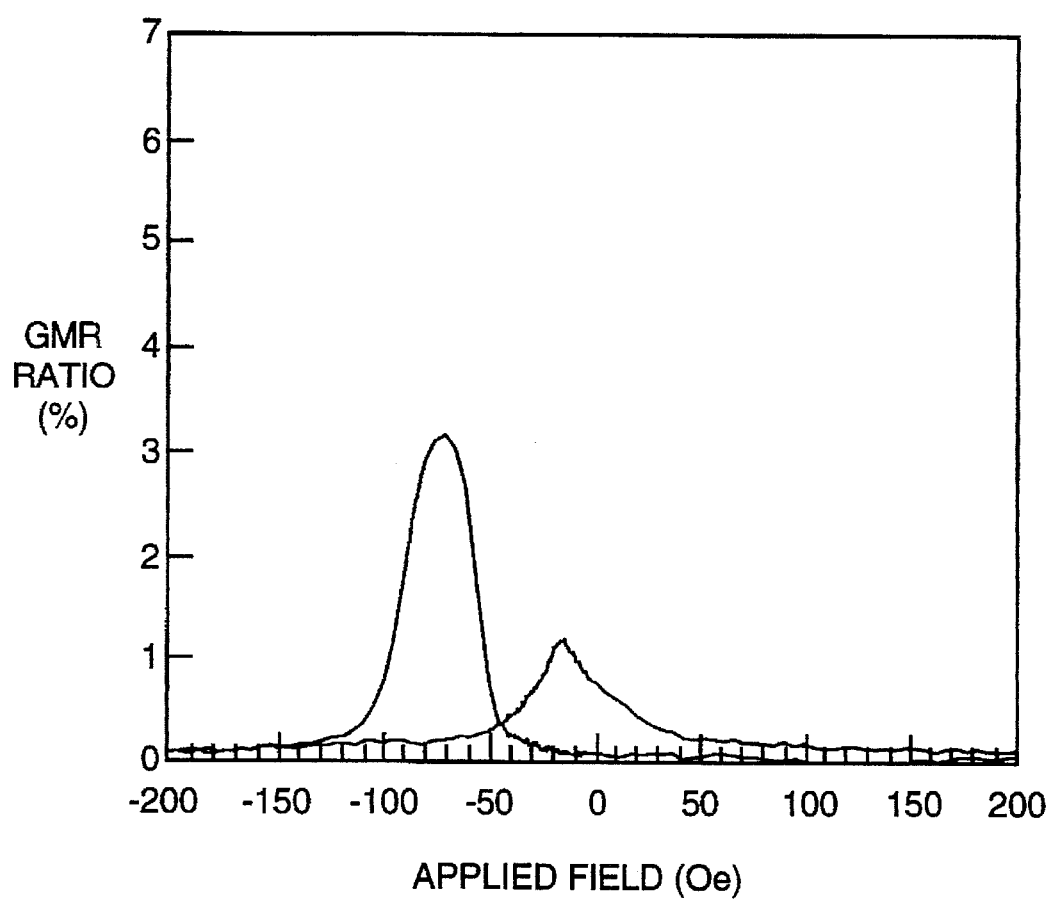
FIG. 5 is a graph showing magnetoresistance versus applied field for a sensor film composed of substrate/Ta 100 Å/CoFe 30 Å/Cu 24 Å/CoFe 30 Å/FeMn 150 Å/Ta 50 Å.

FIG. 5 shows the magnetoresistive (MR) curve, i.e. GMR ratio, for the above material in the case of the thickness being 30 angstroms, relative to applied field. The pinning field is too small for use of the structure as a spin valve. The pinning field depends upon the texture of the second magnetic thin film layer 27 and the anti-ferromagnetic thin film layer 28. It was also found that a preferable texture can be achieved when the first magnetic thin film layer of a single-crystal layer CoFe was 100 angstroms thick; such preferable texture involved a crystal structure of face centered cubic and an orientation of the crystal plane (111) parallel to the film surface (hereinafter referred to as fcc (111) texture). The above reported experiments, shown in FIGS. 4 and 5 were with respect to a single-crystal epitaxial growth homogeneous layer of CoFe constituting the entire first magnetic thin film layer 25.

Figure 6:
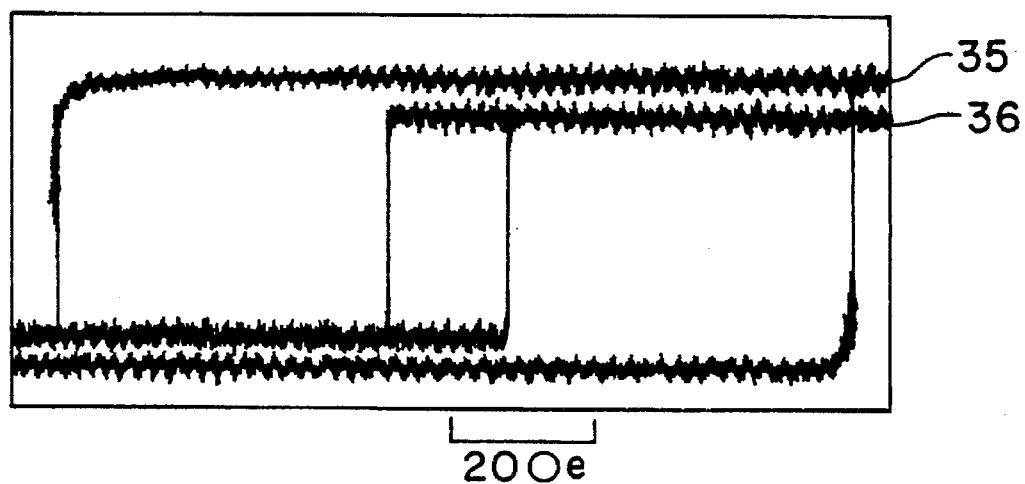
FIG. 6 is a graphical representation of actual hysteresis loops of a signal-layered 100 Å CoFe film (outer curves) and a multilayered film of CoFe 18 Å/(Cu 8 Å/CoFe 18 Å)$_5$ formed on a 100 Å-thick Ta underlayer (inner curves)

Next, the present inventors examined the characteristic of the above-identified spin valve differing only in constructing the first magnetic thin film layer 25 as a multilayer structure of thinner film CoFe layers 33 separated with intermediate thinner film layers 34 of Cu. FIG. 6 shows the experimentally obtained hysteresis loop of the first spin valve of a first magnetic material thin film layer 25 formed as a single-crystal homogeneous layer of CoFe 100 angstroms thick as curve 35, and the second spin valve constructed with the multilayered first magnetic thin film layer 25 formed of magnetic material thinner film layers 33 and intermediate thinner film layers 34 having a total thickness of about 100 angstroms; the thin film layers were epitaxially grown on a 100 angstrom thick Ta underlayer 31. It was observed that the coercivity decreased drastically from 60 Oe to 80 Oe by multilayering the first magnetic thin film layer 25. The crystal texture was also improved by multilayering the first magnetic thin film layer 25.

Figure 7:
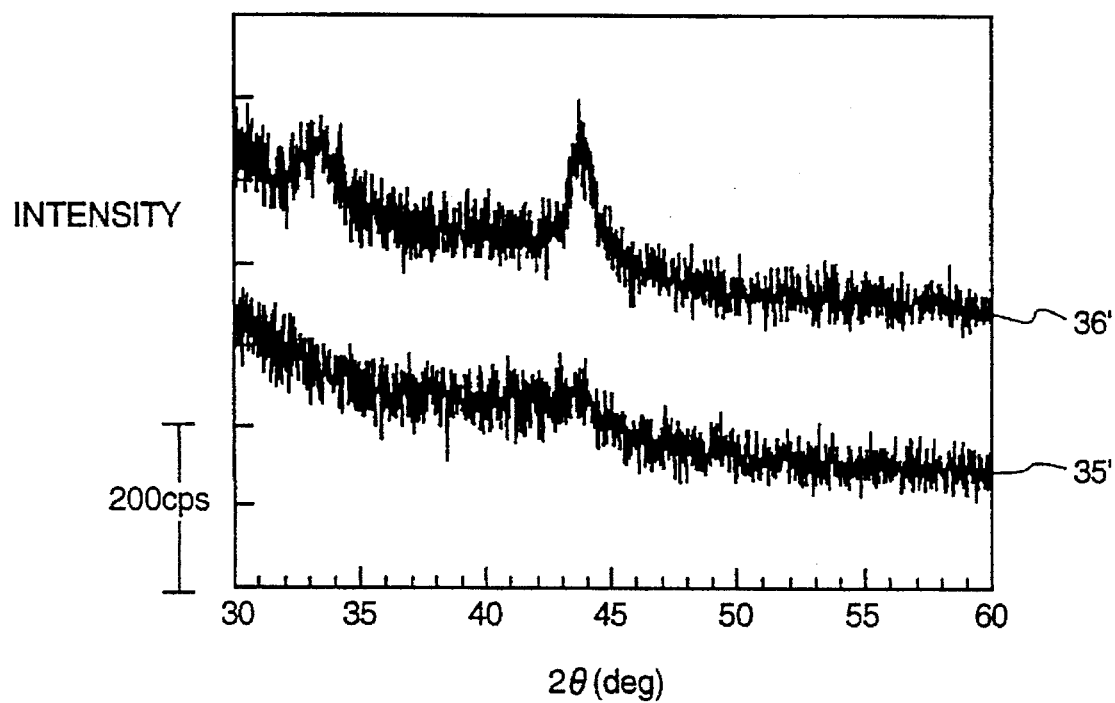
FIG. 7 is a graph showing X-ray diffraction of a single-layered CoFe 100 Å film as one curve and a multilayered film of CoFe 18 Å/(Cu 8 Å/CoFe 18 Å)$_5$ formed on a 100 Å thick Ta underlayer as the other curve.

FIG. 7 shows the X-ray diffraction spectra as curve 35' for the first magnetic thin film layer 25 formed as a homogeneous single-crystal growth layer of CoFe, and as curve 36' for the multilayered first magnetic thin film layer 25 comprising the magnetic material thinner film layers 33 and intermediate thinner film layers 34 respectively of CoFe and Cu. The fcc (111) peak of the CoFe/Cu multilayered (33/34) first thin film layer 25 (curve 36') was found at around 2θ≅45° to be larger than that of the single-crystal growth layer CoFe first magnetic thin film layer 25 shown as curve 35'. Therefore, this shows that the fcc (111) texture was improved by multilayering the first magnetic thin film layer 25. This result was also confirmed by measuring the rocking curve (a measurement that evaluates distribution of crystalline orientation relative to a plane, in this case the XY plane of the films).

Figure 8:
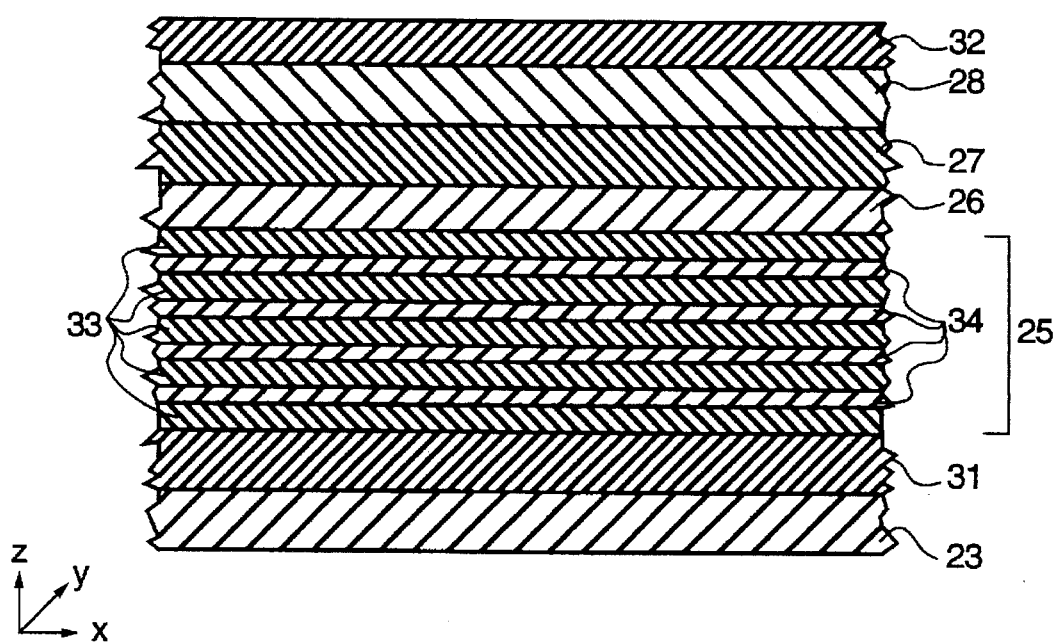
FIG. 8 is an enlarged cross-sectional view through a portion of the magnetoresistance sensor of the present invention.

Based upon the above results, the spin valve having the above-identified structure with the multilayered first magnetic thin film layer 25 including magnetic thinner film layers 33 and intermediate thinner film layers 34, according to the specific structure previously described with respect to FIGS. 8 and 3, were studied and MR curves were measured.

While FeMn was used for the anti-ferromagnetic material of the experimental spin valves, the anti-ferromagnetic material could alternatively be NiMn or NiFeMn, for example. For the experimental spin valves, Ta was used for the capping layer 32.

Three separate spin valves (a), (b), (c) were constructed and were subjected to experimentation, and their layered structure is set forth below, in order, starting with the substrate material. It is seen that these three spin valves (a–c) differ in that the spin valve (c) employs NiFe as the material of the second magnetic thin film layer and the first magnetic thin film layer; and in that spin valves (b) and (c) have a single-crystal epitaxial growth homogeneous layer of magnetic material for the first magnetic thin film layer 25 whereas the spin valve (a) employs an epitaxially grown multilayered first magnetic thin film layer 25 consisting of five thinner film layers 33 separated by four thinner film layers 34 of Cu. The thicknesses of the layers vary as indicated.

(a) glass/Ta 100 Å/CoFe 18 Å/(Cu 8 Å/CoFe18 Å)$_4$/Cu 24 Å/CoFe 30 Å/FeMn 150 Å/Ta 50Å

(b) glass/Ta 100 Å/CoFe 75/Cu 24 Å/CoFe 75 Å/FeMn 150 Å/Ta 50Å

(c) glass/Ta 100 Å/NiFe 100 Å/Cu 24 Å/NiFe 100 Å/FeMn 150 Å/Ta 50Å

Figure 9:
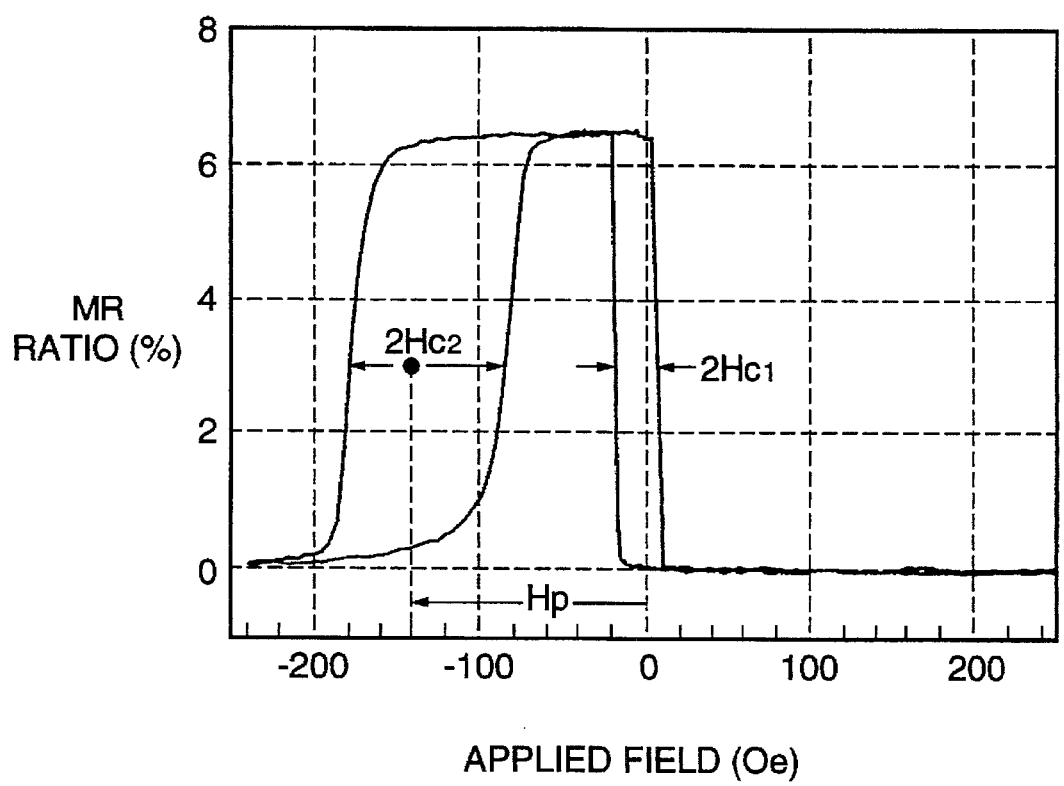
FIG. 9 is a graph which shows magnetoresistance versus field characteristics of a magnetoresistance film constituted by a substrate/Ta 100 Å/CoFe 18 Å/(Cu 8 Å/CoFe 18 Å)$_4$/Cu 24 Å/CoFe 30 Å/FeMn 150 Å/Ta 50 Å.
Figure 10:
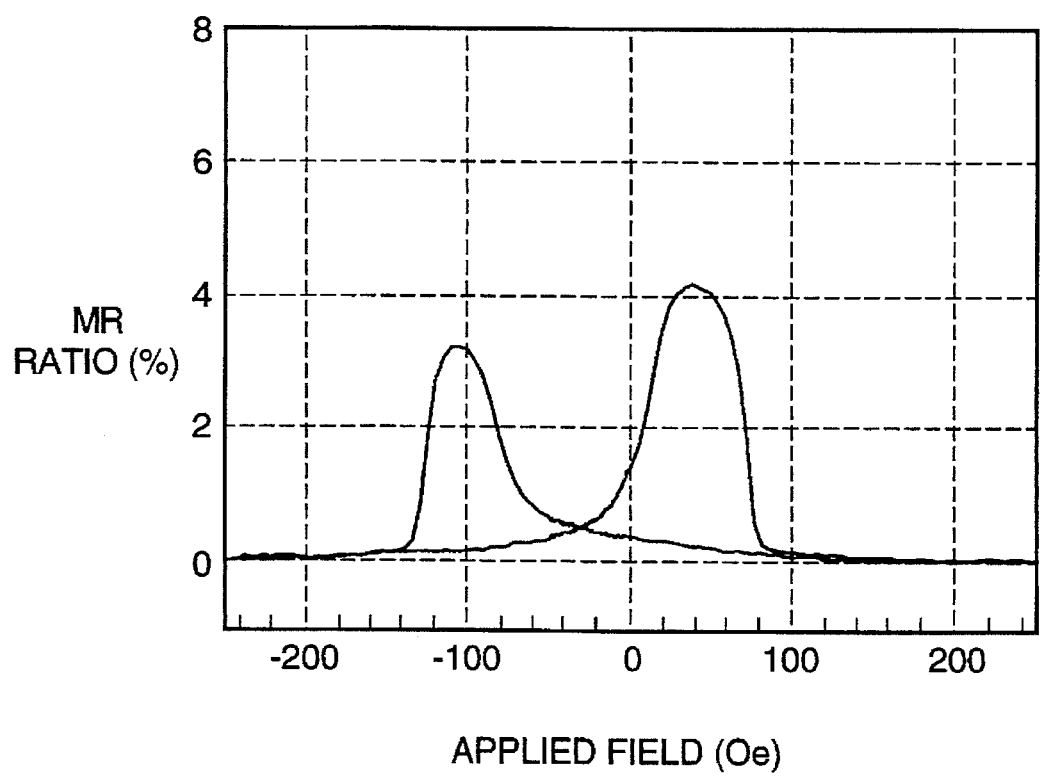
FIG. 10 is a graph showing magnetoresistance versus applied field for a magnetoresistance sensor constructed of a substrate/Ta 100 Å/CoFe 75 Å/Cu 24 Å/CoFe 75 Å/FeMn 150 Å/Ta 50 Å.
Figure 11:
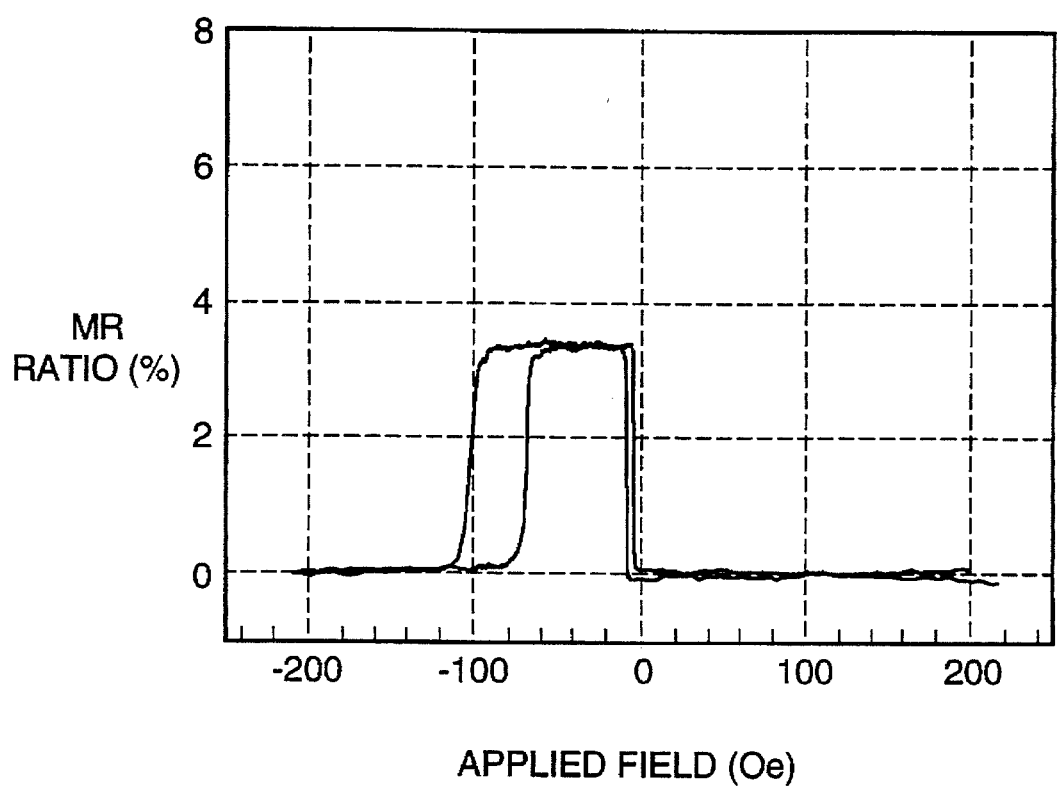
FIG. 11 is a graph which shows magnetoresistance versus applied field of a film composed of a substrate/Ta 100 Å/NiFe 100 Å/Cu 24 Å/NiFe 100 Å/FeMn 150 Å/Ta 50 Å.

FIG. 9 shows the MR ratio curve of spin valve (a), FIG. 10 shows the MR ratio curve of spin valve (b), and FIG. 11 shows the MR ratio curve of spin valve (c). As seen from these figures, the spin valve (a) showed much smaller coercivity in the first magnetic thin film layer 25 than the spin valve (b). The pinning field of the spin valve (a) was much larger than the pinning field of the spin valve (b), with further reference being made to FIG. 5. Therefore, it is seen that multilayering of the first magnetic thin film layer 25 has a first effect to make the coercivity of the first magnetic thin film layer 25 much smaller and a second effect that the pinning field is made much larger as compared to a single-crystal growth homogeneous layer for the first magnetic thin film layer 25. The spin valve (a) also showed a much larger MR ratio than the spin valve (c). More specifically, with respect to FIG. 9, it is seen that $H_P$ is large, whereas $2H_{C2}$ and $2H_{C1}$ are small as compared to the other FIGS. 10 and 11. Magnetostriction was substantially zero for spin valves (a) and (b).

In each of the spin valves (a), (b), the alloy ratio Co to Fe was 90:10.

Figure 12:
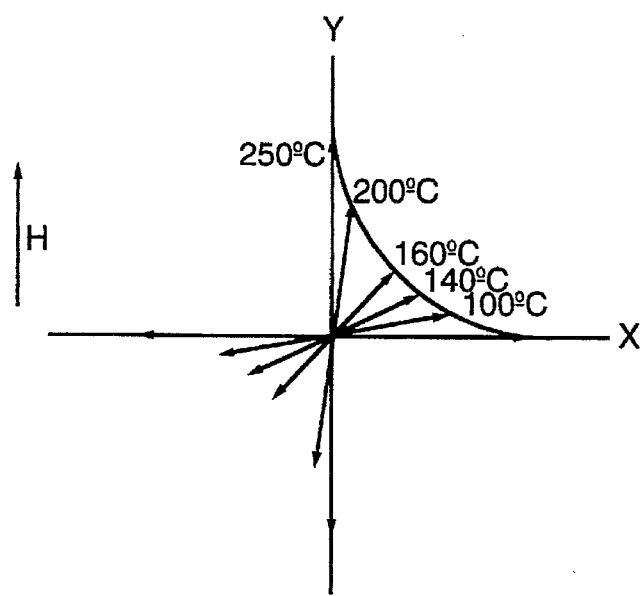
FIG. 12 shows the anisotropy field vector change in a CoFe and Cu multilayer construction for the first magnetic thin film layer of a spin valve, where the change occurs according to the annealing at the indicated temperatures, with the beginning horizontal vector being before annealing.
Figure 13:
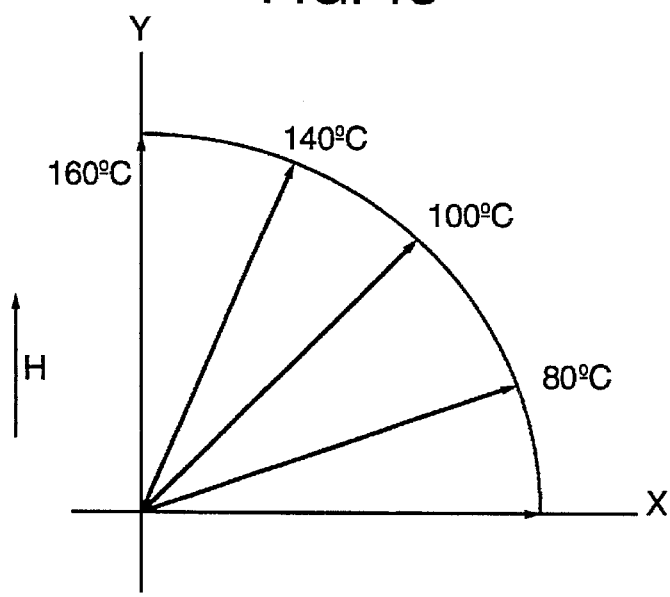
FIG. 13 shows the pinning field vector change in a CoFe single layer thin film magnetic layer that is adjacent to a FeMn anti-ferromagnetic layer of a spin valve constructed with the other thin film magnetic layer of FIG. 12, with the changes being recorded with respect to the indicated annealing temperatures, and the horizontal vector corresponding to the condition before annealing.

Though multilayering of the first magnetic thin film layer 25 was effective as shown above to reduce the coercivity, the anisotropy field of CoFe was relatively high, about 20 Oe, in the equilibrium state. A more specific feature of the present invention reduces the anisotropy field by annealing the sensor in a magnetic field and cooling the thus annealed sensor in the magnetic field so that the layers making up the sensor have a structure characteristic of such annealing and cooling in the magnetic field. Such characteristic structure as having been annealed is shown in FIGS. 12 and 13. The spin valve (a) was annealed (after the experiments reported above relative to FIGS. 9–11) and cooled, both in a magnetic field, with the annealing being at the temperatures 80° C., 100° C., 140° C., 160° C., 200° C. and 250° C.

FIG. 12 shows that the anisotropy field vector change in the first magnetic thin film layer 25 of spin valve (a) rotated from the horizontal before annealing through the various angles indicated by the corresponding annealing temperatures to vertical when the annealing temperature was 250° C. FIG. 12 shows that increasing the annealing temperature first decreases the anisotropy field to a minimum, and thereafter increases the anisotropy field. The direction of the anisotropy field rotated off of the X axis toward the Y axis with increasing annealing temperature. The magnitude of the anisotropy vector was determined by the annealing temperature and the holding time at the annealing temperature. In the case of the CoFe multilayered first magnetic thin film layer 25 of the spin valve (a), the magnitude of the anisotropy field became smallest when the annealing temperature was between 140° C. and 160° C., with a holding time of one hour.

FIG. 13 shows that the pinning field, shown in vector form, in the second magnetic thin film layer 27 of the single-crystal uninterrupted homogeneous layer of CoFe for the spin valve (a), rotated from the horizontal before annealing through the indicated angles to be vertical when the annealing was conducted at 160° C. It was determined that the magnetic field used during annealing and during cooling after annealing should be larger than the magnetic field needed to saturate the first and second magnetic thin film layers 25 and 27. The direction of the easy axis of the first magnetic thin film layer 25 and the pinning direction was the direction of the X axis before annealing. During the annealing process, the magnetic field was applied to the Y axis for both the annealing and the cooling after annealing. The time of holding the spin valve at the annealing temperature was one hour. By increasing the annealing temperature, the pinning field is rotated off of the X-axis toward the Y-axis. The magnitude of the pinning field vector did not change at any annealing temperature. The direction of the pinning field was parallel to the Y-axis when the annealing temperature was 160° C.

The annealing temperature/time dependency of the anisotropy field vector and the pinning field vector varies with the material employed for the respective layers. When different materials are used for the first and second magnetic thin film layers 25, 27 or for the anti-ferromagnetic thin film layer 28, a proper annealing temperature and holding time for the annealing would be chosen based upon the temperature and time dependency of the anisotropy field and pinning field of the material.

Considering the improvement of the texture in the spin valve (a) by the multilayering of the first magnetic thin film layer 25, it may be appreciated that multilayering (although not shown in the drawing) of the second magnetic thin film layer 27 using, for example, CoFe and Cu would also be effective to achieve higher pinning fields in the second magnetic thin film layer 27; in such a case, the Cu thickness for the intermediate thinner film layers would be smaller than a value which gives strong coupling among CoFe thinner film layers in the second magnetic thin film layer 27, because all of the magnetization in the second magnetic thin film layer should be strongly pinned in a specific direction for the spin valve type of sensor. That is, for both the first and second magnetic thin film layers, when they are multilayered, separation between the magnetic material thinner film layers 33 must be sufficiently small that they have parallel magnetization within the magnetic thin film layer 25 and parallel magnetization within the magnetic thin film layer 27, although magnetization direction between thin film layer 25 and 27 can and preferably does differ by an angle θ. With a choice of Cu as a material for the intermediate material thinner film layers 34 to provide such separation, the thickness of the Cu is preferably smaller than 10 angstroms, with experimental data proving this point for experiments conducted with respect to thicknesses of above 10 angstroms, 10 angstroms, 8 angstroms and 4 angstroms.

As a more specific feature of the present invention, it was found that the use of nickel in the first and/or second magnetic thin film layers 25 and 27 alloyed with the CoFe has advantages. Particularly, the pinning field becomes larger with an increase in the nickel content of the first and/or second magnetic thin film layers 25, 27. Increasing the nickel content causes two effects: the first effect is to reduce the saturation magnetization of the second magnetic thin film layer 27; and the second effect is that of improving the texture of all the layers. With respect to the first effect, the relation between the exchange coupling energy Eex, pinning field Hp and saturization magnetization Ms is written as follows:

$$Eex=HpMs$$

Figure 14:
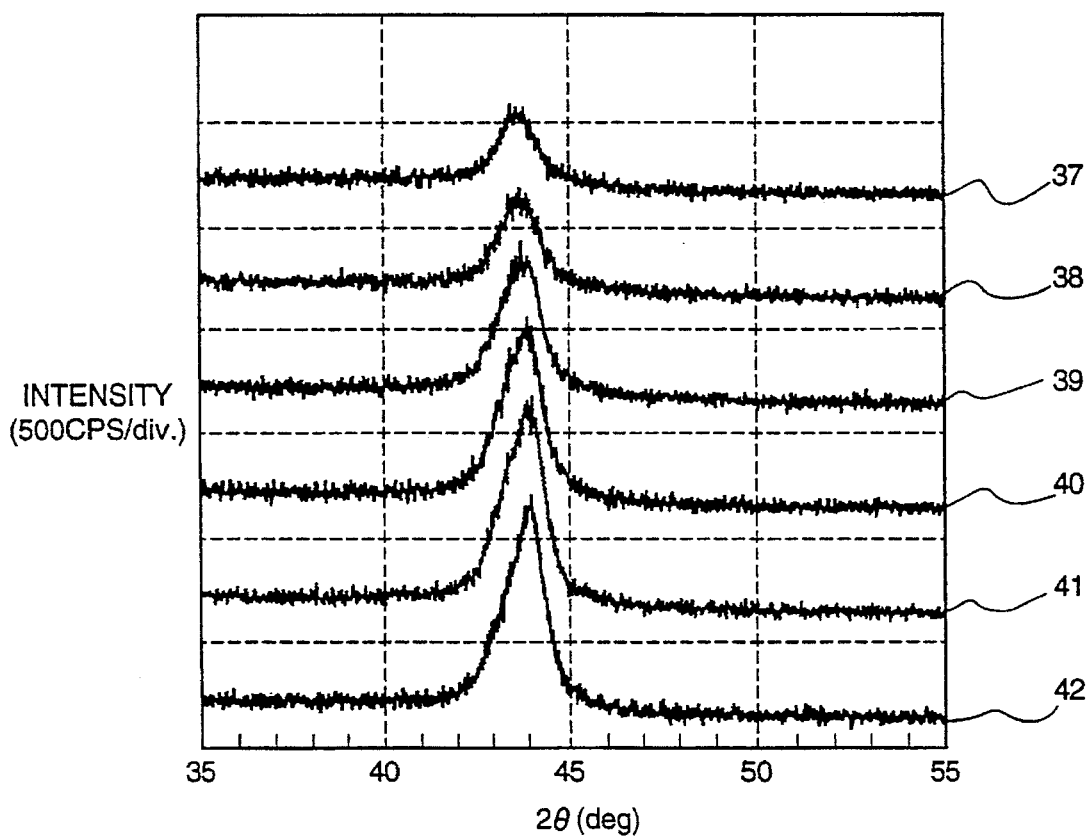
FIG. 14 is a graph showing X-ray diffraction of a magnetoresistance film constructed of Ta 100 Å/CoNiFe 18 Å/(Cu 8 Å/CoNiFe 18 Å)$_5$/Cu24 Å/CoNiFe 30 Å/FeMn 150 Å/Ta 50 Å, wherein the curves from top to bottom correspond to the magnetic layer alloy having a Ni content respectively, by percent weight, 0, 29, 34, 40, 49, 53, and wherein the sensor is a spin valve, with a crystalline structure of face centered cubic and orientation of (111) parallel to the faces of the layers, and the Co to Fe ratio being 90:10 in each of the alloys.

If the exchange coupling energy Eex is to remain constant, reducing the saturization magnetization makes the pinning field Hp larger. With respect to the second effect of improving the crystal texture by the use of nickel, reference is made to FIG. 14. FIG. 14 shows the X-ray diffraction spectra of a spin valve having the sensor films of underlayer 31 being Ta 100 angstroms, first magnetic thin film layer 25 consisting of a first thinner film layer 33 of CoNiFe of 18 angstroms thickness followed by four intermediate thinner film layers of Cu of 8 angstroms thickness alternating with four thinner film layers 33 of CoNiFe of 18 angstroms thickness, non-magnetic thin film layer 26 of Cu of 24 angstroms thickness, second magnetic thin film layer 27 comprised of CoNiFe of 30 angstroms thickness, anti-ferromagnetic thin film layer 28 of FeMn of 150 angstroms thickness, and capping layer 32 of Ta of 50 angstroms thickness. By increasing the Ni content, the (111) peak intensity becomes larger, which means that the (111) texture improves with increasing Ni content, as shown in FIG. 14.

In FIG. 14, the curve 37 is for a nickel content of 0% by weight, the curve 38 is for a nickel content of 29% by weight, the curve 39 is for a nickel content of 34% by weight, the curve 40 is for a nickel content of 40% by weight, the curve 41 is for a nickel content of 49% by weight, and the curve 42 is for a nickel content of 53% by weight.

Figure 15:
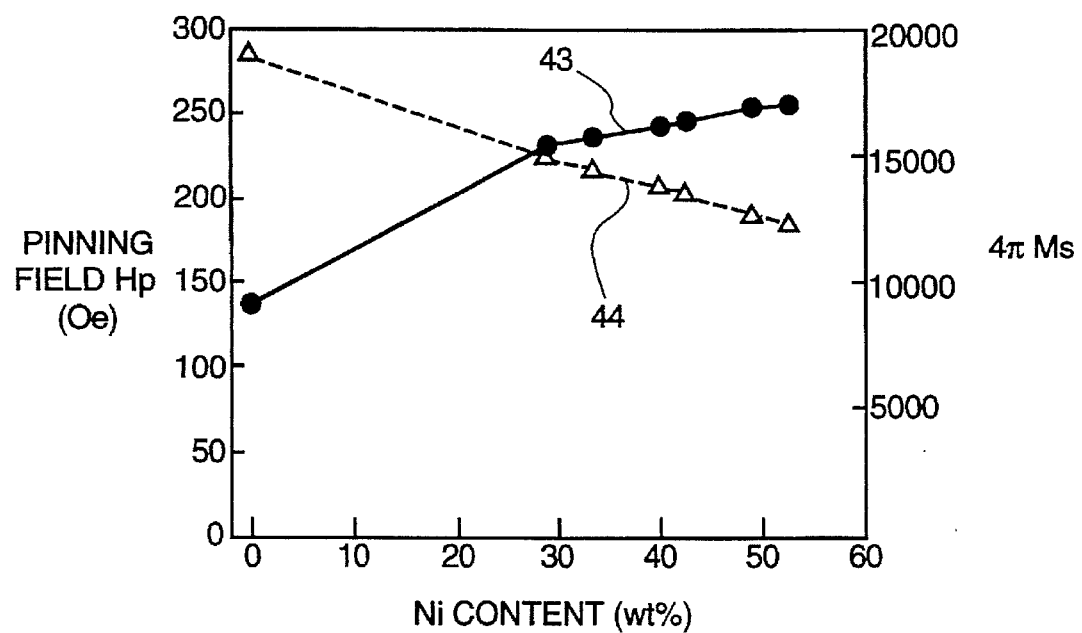
FIG. 15 is a graph which shows the Ni content dependency of the pinning field and the saturation magnetization of the above-identified CoNiFe magnetic thin film layer spin valve employed in FIG. 11, with the curve extending from the lower left to the upper right relating to the pinning field, whereas the curve extending from the upper left to the lower right is a curve relating to saturization magnetization.

FIG. 15 shows the effect of the nickel content on the composition of the first and/or second magnetic thin film layers 25, 27, with respect to the alloy CoNiFe. With respect to both FIGS. 14 and 15, the ratio of Co to Fe is 90:10. Curve 43, formed by interconnecting the experimental values indicated with solid dots, shows the effect of the nickel content on the pinning field. Curve 44 formed by interconnecting the experimental values indicated with triangles, shows the effect of the nickel content on the saturation magnetization of the second magnetic thin film layer 27. It is seen that increasing the nickel content from 0 to 53% in the alloy ($Co_{90}Fe_{10}$) Ni increases the pinning field from 150 Oe to 260 Oe.

From the above, it is seen that the present invention relates to an improved GMR sensor, wherein the improvement resides in forming one or both of the first and second magnetic thin film layers as a multilayer. There may be other magnetic thin film layers, such as in the structure of a double spin valve, and such additional magnetic thin film layers could benefit from multilayering according to the present invention. The magnetic thinner film layers of a multilayered magnetic thin film layer, according to the present invention, have the following characteristics:

They have their magnetizations parallel, that is in the same direction; the multilayered magnetic thin film layer as a whole is highly oriented, meaning that the orientation of a specific crystal plane is far more uniform throughout the thickness of the thin film than it would have been if the thin film was homogeneously epitaxially grown as a single-crystal in one layer, which is believed to be the case because the multilayers of magnetic material have their crystal epitaxial growth disturbed to the extent that grain size in the X-Y plane reduces across such disturbance at the interface between layers; a disturbance at the interfaces, with a separate layer such as non-magnetic copper, is insufficient to produce anti-parallel magnetizations between the multilayers of magnetic material 33.

Most preferably, the Co:Fe ratio is 90:10; and more preferably, the CoFe is alloyed with Ni, at a substantial percentage.

With the crystal texture is such that the crystal plane is highly oriented; that is, the multilayering increases the ordering of the crystal plane orientation. Preferably, crystal plane orientation is such that the (111) plane is substantially parallel to the major surfaces of the thin films. The orientation becomes more highly oriented as the number of layers is increased in the multilayered magnetic thin film layer. The crystal plane orientation is maintained by choosing the intermediate material thinner film layers 34 of the same crystal structure as the magnetic material of the magnetic thinner film layers 33, the first and second magnetic thin film layers 25, 27 and the non-magnetic thin film layer 26. Preferably, the underlayer 31 is chosen so as to provide a highly ordered or good orientation of the (111) plane during the start of epitaxial growth of layers 25, 26, 27, 28.

As the growth of a crystal proceeds, the orientation becomes less ordered, and it is believed that interruption of the epitaxial growth, for example by the interposition of the intermediate thinner film layers 34 (magnetic or non-magnetic) will reorder the (111) plane for good orientation start of subsequent crystal epitaxial growth, and thereby to reduce the average grain size in the X-Y plane of the magnetic thin film multilayered layer. The reduced average grain size is thought to be advantageous, because there is exchange coupling between adjacent crystal grains, and the exchange coupling volume of the grain becomes proportionately larger as the grain size is reduced, which is again an advantage of the multilayering of the present invention. The improvement in the MR ratio is seen when comparing FIG. 9, which relates to the multilayering of the present invention, and FIG. 10, which relates to a single crystal growth for the thickness of a magnetic thin film layer.

Although the use of Ta as an underlayer is known to improve (111) orientation, it is particularly advantageous in the present invention, wherein such orientation is reestablished by the multilayering.

It is believed that multilayering would not be effective if the multilayering was such that there was anti-parallel magnetization for the thinner film layers 33.

Further modifications in the present invention are contemplated. For example, instead of using an anti-ferromagnetic material to pin the magnetization orientation of the second magnetic thin film layer of a spin valve, it is possible to employ a permanent magnet or to employ a magnetic material having hard magnetization as compared to soft magnetization of the first magnetic thin film layer.

The annealing and cooling with a suitable magnetic field is particularly advantageous to the present multilayered magnetic thin film layer. A magnetic thin film layer having a single-crystal epitaxial growth throughout its thickness has a low orientation of the fcc (111), whereas the present invention's multilayered (but otherwise identical) magnetic thin film layer is highly oriented or ordered with respect to the fcc (111).

In the multilayering, it is not essential that the thicknesses of the intermediate thinner film layers 34 be all the same or that the thicknesses of the magnetic material thinner film layers 33 be all the same, although they should be sufficiently uniform that parallel magnetization is obtained, and they should be sufficiently thin that the crystal plane orientation remains substantially the same.

The substrate may be AlTiC. Capping material may be $Al_2O_3$ as an insulator. The magnetic shield materials may be $Ni_{80}Fe_{20}$ or FeAlSi. The magnetic material thinner film layer 33 may be composed of NiFe or CoFe or CoNiFe. The intermediate material thinner film layers 34 and the thin film layer 26 may be composed of Cu, Ni or NiFe.

It is desirable to increase Hp to more strongly fix the magnetization. A large height to the curve of FIG. 9 is a desirable attribute. With respect to FIG. 9, separation of the curves in the horizontal direction is desirable, resulting in a desirably smaller $Hc_2$ and $Hc_1$.

The anti-ferromagnetic material may be FeMn, or NiMn, or NiO.

While a preferred embodiment of the present invention has been described in detail, with variations and modifications, further embodiments, variations and modifications are contemplated within the broader aspects of the present invention, in addition to the advantageous details, in accordance with the spirit and scope of the following claims.

We claim:

1. A magnetoresistive spin-valve sensor of the giant magnetoresistive type, comprising:

a first magnetic thin film layer of substantially ferromagnetic material;

a second magnetic thin film layer of substantially ferromagnetic material;

a non-magnetic thin film layer of non-magnetic metallic material sandwiched between said first and second magnetic thin film layers;

a thin film layer of anti-ferromagnetic material adjacent to said second magnetic thin film layer and in exchange coupling at adjacent surfaces with said second magnetic thin film layer to fix a magnetization orientation of said second magnetic thin film layer along a substantially fixed first direction;

said first magnetic thin film layer having a magnetization orientation that is in a second direction that is freely movable relative to said first direction in response to externally applied magnetic fields to be sensed, for thereby changing resistance of the layers to a passage of an electric sensing current in proportion to a first power of cosine of an angle θ between said first direction and said second direction;

said first magnetic thin film layer, said second magnetic thin film layer, said thin film layer of anti-ferromagnetic material and said non-magnetic thin film layer each having a same crystal structure and a same crystal plane orientation; and said first magnetic thin film layer comprising a plurality of magnetic thinner film layers of ferromagnetic material with the same crystal plane orientation from one of said magnetic thinner films to another, and an interlayer between each adjacent ones of said magnetic thinner film layers providing a discontinuity in single-crystal epitaxial growth between each of said magnetic thinner film layers.

2. A magnetoresistive sensor according to claim 1, wherein each of said magnetic thinner film layers is composed of an alloy including each of Fe, Ni and Co.

3. A magnetoresistive sensor according to claim 2, wherein said alloy has Co and Fe in a weight ratio of 90:10.

4. A magnetoresistive sensor according to claim 3, wherein said alloy is more than 50% by weight Co, and the remainder Fe and Ni.

5. A magnetoresistive sensor according to claim 1, wherein said first magnetic thin film layer and said second magnetic thin film layer have magnetization directions parallel to each other.

6. A magnetoresistive sensor according to claim 1, wherein said crystal structure is a face centered cubic structure.

7. A magnetoresistive sensor according to claim 1, wherein said crystal orientation is an orientation of a crystal plane (111) substantially parallel to all of said thin film layers.

8. A magnetoresistive sensor according to claim 1, wherein each magnetic thinner film layer in said first magnetic thin film layer has a thickness of 30 angstroms or less.

9. A magnetoresistive sensor according to claim 1, wherein: said first magnetic thin film layer has said magnetic thinner film layers separated from each other and sandwiching therebetween said interlayers that cut single-crystal grain epitaxial growth between said magnetic thinner film layers; and said interlayers have the same crystal structure and crystal plane orientation as said magnetic thinner film layers.

10. A magnetoresistive sensor according to claim 9, wherein said interlayers include elemental Cu or a Cu alloy.

11. A magnetoresistive sensor according to claim 9, wherein said interlayers include elemental Ni or a Ni alloy.

12. A magnetoresistive sensor according to claim 9, wherein each of said interlayers is less than 10 angstroms thick.

13. A magnetoresistive sensor according to claim 1, further including means providing a longitudinally extending magnetic field through all of said thin film layers in an amount sufficient to reduce Barkhausen noise.

14. A magnetoresistive sensor according to claim 1, wherein said first magnetic thin film layer as a whole has a magnetostriction that is less than $3 \times 10^{-6}$.

15. A magnetoresistive sensor according to claim 1, wherein said first magnetic thin film layer as a whole has a magnetostriction that is less than $1 \times 10^6$.

16. A magnetoresistive sensor according to claim 1, wherein said first magnetic thin film layer, said second magnetic thin film layer, said thin film layer of anti-ferromagnetic material and said non-magnetic thin film layer exhibit a magnetic orientation and annealed structure resulting from being annealed and cooled in a magnetic field sufficiently to have an anisotropic energy of said first magnetic thin film layer in an equilibrium state that is smaller than an identical structure before annealing.

17. A magnetoresistive sensor according to claim 1, further including an underlayer of one of Ta, Zr, Nb, Ti and Hf, and a substrate sandwiching said underlayer between said substrate and said first magnetic thin film layer.

18. A magnetoresistive sensor according to claim 1, further including first and second magnetic shields on respective faces of said thin film layer of anti-ferromagnetic material and said first magnetic thin film layer, which faces are opposite sides from said second magnetic thin film layer.

19. A magnetoresistive sensor of the giant magnetoresistive type, comprising:
a first magnetic thin film layer of substantially ferromagnetic material;
a second magnetic thin film layer of substantially ferromagnetic material;
a non-magnetic thin film layer of non-magnetic metallic material sandwiched between said first and second magnetic thin film layers;
said second magnetic thin film layer having a fixed magnetization orientation along a substantially fixed first direction;
said first magnetic thin film layer having a magnetization orientation that is in a second direction that is freely movable relative to said first direction in response to externally applied magnetic fields to be sensed, for thereby changing resistance of the layers to a passage of an electric sensing current in proportion to a first power of cosine of an angle θ between said first direction and said second direction;
said first magnetic thin film layer, said second magnetic thin film layer and said non-magnetic thin film layer each having a same crystal structure and a same crystal plane orientation; and
said first magnetic thin film layer comprising a plurality of magnetic thinner film layers of ferromagnetic material with the same crystal plane orientation from one of said magnetic thinner films to another, and an interlayer between each adjacent ones of said magnetic thinner film layers providing a discontinuity in single-crystal epitaxial growth between each of said magnetic thinner film layers.

20. A magnetoresistive sensor according to claim 19, wherein each of said magnetic thinner film layers is composed of an alloy including each of Fe, Ni and Co.

21. A magnetoresistive sensor according to claim 20, wherein said alloy has Co and Fe in a weight ratio of 90:10.

22. A magnetoresistive sensor according to claim 19, wherein said crystal structure is a face centered cubic structure.

23. A magnetoresistive sensor according to claim 19, wherein said crystal orientation is an orientation of a crystal plane (111) substantially parallel to all of said thin film layers.

24. A magnetoresistive sensor according to claim 19, wherein each magnetic thinner film layer in said first magnetic thin film layer has a thickness of 30 angstroms or less.

25. A magnetoresistive sensor according to claim 19, wherein: said first magnetic thin film layer has said magnetic thinner film layers separated from each other and sandwiching therebetween said interlayers that cut single-crystal grain epitaxial growth between said magnetic thinner film layers; and said interlayers have the same crystal structure and crystal plane orientation as said magnetic thinner film layers.

26. A magnetoresistive sensor according to claim 19, wherein said first magnetic thin film layer, said second magnetic thin film layer and said non-magnetic thin film layer exhibit a magnetic orientation and annealed structure resulting from being annealed and cooled in a magnetic field sufficiently to have an anisotropic energy of said first magnetic thin film layer in an equilibrium state that is smaller than an identical structure before annealing.

27. A magnetoresistive sensor of the giant magnetoresistive type, comprising:
a first magnetic thin film layer of substantially ferromagnetic material;
a second magnetic thin film layer of substantially ferromagnetic material;
a non-magnetic thin film layer of non-magnetic metallic material sandwiched between said first and second magnetic thin film layers;
said second magnetic thin film layer having a magnetization orientation along a first direction;
said first magnetic thin film layer having a magnetization orientation that is in a second direction that is freely movable relative to said first direction in response to externally applied magnetic fields to be sensed, for thereby changing resistance of the layers to a passage of an electric sensing current in proportion to a first power of cosine of an angle θ between said first direction and said second direction;

said first magnetic thin film layer, said second magnetic thin film layer and said non-magnetic thin film layer each having a same crystal structure and a same crystal plane orientation; and said first magnetic thin film layer comprising a plurality of magnetic thinner film layers of ferromagnetic material with the same crystal plane orientation from one of said magnetic thinner films to another, and an interlayer between each adjacent ones of said magnetic thinner film layers providing a discontinuity in single-crystal epitaxial growth between each of said magnetic thinner film layers.

28. A magnetoresistive sensor according to claim 27, wherein each of said magnetic thinner film layers is composed of an alloy including each of Fe, Ni and Co.

29. A magnetoresistive sensor according to claim 28, wherein said alloy has Co and Fe in a weight ratio 90:10.

30. A magnetoresistive sensor according to claim 27, wherein said crystal structure is a face centered cubic structure.

31. A magnetoresistive sensor according to claim 27, wherein said crystal orientation is an orientation of a crystal plane (111) substantially parallel to all of said thin film layers.

32. A magnetoresistive sensor according to claim 27, wherein each magnetic thinner film layer in said first magnetic thin film layer has a thickness of 30 angstroms or less.

33. A magnetoresistive sensor according to claim 27, wherein: said first magnetic thin film layer has said magnetic thinner film layers separated from each other and sandwiching therebetween said interlayers that cut single-crystal grain epitaxial growth between said magnetic thinner film layers; and said interlayers have the same crystal structure and crystal plane orientation as said magnetic thinner film layers.

34. A magnetoresistive sensor according to claim 27, wherein said first magnetic thin film layer, said second magnetic thin film layer and said non-magnetic thin film layer exhibit a magnetic orientation and annealed structure resulting from being annealed and cooled in a magnetic field sufficiently to have an anisotropic energy of said first magnetic thin film layer in an equilibrium state that is smaller than an identical structure before annealing.

35. A magnetoresistive sensor according to claim 27, wherein said second magnetic thin film layer has a permanent magnetic bias provided by an applied electric current.

36. A magnetoresistive sensor according to claim 27, wherein said second magnetic thin film layer has a permanent magnetic bias applied by a permanent magnet.

37. A magnetoresistive sensor according to claim 27, wherein said second magnetic thin film layer has a permanent magnetic bias supplied by said second thin film layer being a hard ferromagnetic material relative to said first thin film layer being a soft ferromagnetic material.

38. In a magnetic information data storage system, having:

a magnetic storage medium having a plurality of tracks for recording data as separate magnetic domains along said tracks, and a magnetic transducer being maintained in a closely spaced position relative to said magnetic storage medium during relative movement between said magnetic transducer and said magnetic storage medium for transducing, said magnetic transducer including a magnetoresistive sensor of the giant magnetoresistive type, comprising:

a first magnetic thin film layer of substantially ferromagnetic material;

a second magnetic thin film layer of substantially ferromagnetic material;

a non-magnetic thin film layer of non-magnetic material sandwiched between said first and second magnetic thin film layers;

said second magnetic thin film layer having a magnetization orientation along a first direction;

said first magnetic thin film layer having a magnetization orientation that is in a second direction that is freely movable relative to said first direction in response to externally applied magnetic fields to be sensed, for thereby changing resistance of the layers to a passage of an electric sensing current in proportion to a first power of cosine of an angle θ between said first direction and said second direction;

said first magnetic thin film layer, said second magnetic thin film layer and said non-magnetic thin film layer each having a same crystal structure and a same crystal plane orientation; and said first magnetic thin film layer comprising a plurality of magnetic thinner film layers of ferromagnetic material with the same crystal plane orientation from one of said magnetic thinner films to another, and an interlayer between each adjacent ones of said magnetic thinner film layers providing a discontinuity in single-crystal epitaxial growth between each of said magnetic thinner film layers.

39. A magnetic information data storage system according to claim 38, wherein a magnetic easy axis for each of said first and second magnetic thin film layers is substantially perpendicular to a track width of said tracks.

40. A magnetic information data storage system according to claim 38, further including: a motor connected between said magnetic storage medium and said magnetoresistive sensor for relatively moving said magnetoresistive sensor along said tracks; a separate motor connected between said magnetic storage medium and said magnetoresistive sensor for moving said magnetic storage medium and magnetoresistive sensor relative to each other in a direction generally perpendicular to said tracks for accessing; and a control circuit controlling speed and operation of said motors.

41. A magnetic information data storage system according to claim 38, wherein said interlayers are composed of magnetic materials.

42. A magnetic information data storage system according to claim 38, wherein said interlayers are composed of non-magnetic materials.

43. A magnetic information data storage system according to claim 38, wherein crystal growth is discontinuous between said thinner film layers so that average crystal grain size of said first thin film layer is substantially less than average crystal grain size of a thin film layer identical in all respects except for being composed of only a single-crystal epitaxial layer, in a plane of said first thin film layer.

44. A magnetic information data storage system according to claim 38, wherein said magnetic thinner film layers have matched exchange couplings between layers.

45. A magnetic information data storage system according to claim 38, wherein each of said magnetic thinner film layers has an identical material composition.

46. A magnetic information data storage system according to claim 38, wherein each of said magnetic thinner film layers is composed of a alloy including each of Fe, Ni and Co.

47. A magnetic information data storage system according to claim 46, wherein said alloy preferably has a Co composition of greater than 50% by weight.

48. A magnetic information data storage system according to claim 46, wherein said alloy has Co and Fe in a weight ratio of 90:10.

49. A magnetic information data storage system according to claim 46, wherein said alloy includes Ni in an amount between 30 and 53% by weight.

50. A magnetic information data storage system according to claim 38, wherein said crystal structure is a face centered cubic structure.

51. A magnetic information data storage system according to claim 38, wherein said crystal orientation is an orientation of a crystal plane (111) substantially parallel to all of said thin film layers.

52. A magnetic information data storage system according to claim 38, wherein each magnetic thinner film layer in said first magnetic thin film layer has a thickness of 30 angstroms or less.

53. A magnetic information data storage system according to claim 38, wherein: said first magnetic thin film layer has said magnetic thinner film layers separated from each other and sandwiching therebetween said interlayers that cut single-crystal grain growth between said magnetic thinner film layers; and said interlayers have the same crystal structure and crystal plane orientation as said magnetic thinner film layers.

54. A magnetic information data storage system according to claim 38, wherein said first magnetic thin film layer, said second magnetic thin film layer and said non-magnetic thin film layer exhibit magnetic orientation and annealed structure resulting from being annealed and cooled in a magnetic field sufficiently to have an anisotropic energy of said first magnetic thin film layer in an equilibrium state that is smaller than an identical structure before annealing.

55. A magnetic information data storage system according to claim 38, wherein said magnetoresistive sensor further includes a thin film layer of anti-ferromagnetic material adjacent to said second magnetic thin film layer and in exchange coupling at adjacent surfaces with said second magnetic thin film layer to fix a magnetization orientation of said second magnetic thin film layer along a substantially fixed first direction.

56. A magnetic information data storage system according to claim 38, wherein said magnetoresistive sensor further includes means fixing said first direction.

* * * * *